United States Patent
Zebhauser et al.

(10) Patent No.: US 11,205,829 B2
(45) Date of Patent: Dec. 21, 2021

(54) PLUG CONNECTOR FOR CONNECTING A WAVEGUIDE WITHIN A HOUSING TO AT LEAST ONE ELECTRICAL CONDUCTOR THROUGH AN ANTENNA IN A SIGNAL CONVERTER

(71) Applicant: Rosenberger Hochfrequenztechnik GmbH & Co. KG, Fridolfing (DE)

(72) Inventors: Martin Zebhauser, Laufen (DE); Rainer Bippus, Teisendorf (DE); Gunnar Armbrecht, Muehldorf (DE); Michael Wollitzer, Fridolfing/Pietling (DE); Raimund Klapfenberger, Palling (DE); Florian Westenkirchner, Haiming (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 16/480,638

(22) PCT Filed: Jan. 18, 2018

(86) PCT No.: PCT/EP2018/051177
§ 371 (c)(1),
(2) Date: Jul. 24, 2019

(87) PCT Pub. No.: WO2018/137991
PCT Pub. Date: Aug. 2, 2018

(65) Prior Publication Data
US 2020/0014087 A1    Jan. 9, 2020

(30) Foreign Application Priority Data
Jan. 25, 2017 (EP) .................................. 17152968

(51) Int. Cl.
*H01P 5/08* (2006.01)
*H01P 3/16* (2006.01)
(Continued)

(52) U.S. Cl.
CPC ................. *H01P 5/087* (2013.01); *H01P 3/16* (2013.01); *H01P 5/103* (2013.01); *H01P 5/107* (2013.01);
(Continued)

(58) Field of Classification Search
CPC .......... H01P 5/087; H01P 5/103; H01P 5/107; H01P 5/1015
(Continued)

(56) References Cited

U.S. PATENT DOCUMENTS 9,490,518 B1    11/2016 Herbsommer et al.
2014/0240062 A1   8/2014 Herbsommer et al.
(Continued)

FOREIGN PATENT DOCUMENTS

DE    10 2005 054 233 A1    5/2007
DE    10 2014 218 339 A1    3/2016
EP         2 988 365 A1    2/2016

OTHER PUBLICATIONS

Notification of Transmittal and international Search Report, and Written Opinion of the International Searching Authority in PCT/EP2018/051177 (13 pages).

*Primary Examiner* — Benny T Lee
(74) *Attorney, Agent, or Firm* — Donald S. Showalter, Esq.; GrayRobinson, P.A.

(57) ABSTRACT

A preferred embodiment of a plug connector for connecting a waveguide to at least one electric conductor may have a housing for connecting to the waveguide. Fastening means may be provided to attach the housing to a structure having the at least one electric conductor. The housing may accom- (Continued)

modate a signal converter having an antenna arrangement. A waveguiding arrangement may be provided within the housing. The waveguiding arrangement may guide an electromagnetic wave into the waveguide and may be paired with the antenna arrangement. The signal converter may be connected to at least one electric conductor and may perform conversion between electric signals and high-frequency electromagnetic signals.

4 Claims, 4 Drawing Sheets

(51) Int. Cl.
*H01Q 1/24* (2006.01)
*H01R 24/50* (2011.01)
*H01P 5/107* (2006.01)
*H01P 5/103* (2006.01)

(52) U.S. Cl.
CPC ............... *H01Q 1/24* (2013.01); *H01R 24/50* (2013.01); *H01L 2223/6677* (2013.01)

(58) Field of Classification Search
USPC .................................................. 333/26, 248
See application file for complete search history.

(56) References Cited

U.S. PATENT DOCUMENTS

2015/0372388 A1   12/2015  Martineau et al.
2016/0036114 A1*  2/2016  Okada ..................... H02J 5/005
                                                      307/104
2016/0164232 A1    6/2016  Lane et al.

\* cited by examiner

PLUG CONNECTOR FOR CONNECTING A WAVEGUIDE WITHIN A HOUSING TO AT LEAST ONE ELECTRICAL CONDUCTOR THROUGH AN ANTENNA IN A SIGNAL CONVERTER

CROSS REFERENCE TO RELATED APPLICATIONS

This is a U.S. National Phase Entry under 35 U.S.C. § 371 of International Application No. PCT/US2018/051177 filed Jan. 18, 2018 entitled: PLUG CONNECTOR FOR CONNECTING A WAVEGUIDE TO AT LEAST ONE ELECTRIC CONDUCTOR which designated the United States and at least one other country in addition to the United States and claims priority to European Patent Application No. 17 152 968.8 which was filed Jan. 25, 2017 which subsequently issued as European Patent No/EP 3 355 419 B1.

STATEMENT REGARDING FEDERALLY-SPONSORED RESEARCH OR DEVELOPMENT

Not applicable.

INCORPORATION BY REFERENCE

International Application No. PCT/EP2018/051177, and European Patent Application No. 17 152 968.8 are each expressly incorporated herein by reference in their entireties to form part of the present disclosure.

FIELD OF THE INVENTION

The invention relates to a plug connector for connecting a waveguide to at least one electrical conductor. The invention moreover relates to a signal processing unit having such a plug connector and a system for transmitting high-frequency electromagnetic signals between two signal processing units.

BACKGROUND

Signal transmission using conventional electrical conductors such as, for example, copper conductors in electrical cables, is known to be subject to strong signal attenuation at high frequencies. Therefore, in particular when high demands are made on the signal transmission bandwidth, substantial effort is sometimes required to achieve the specifications required for a particular application if achieving those specifications is even all possible. This applies in particular when long transmission distances should be covered and only a small number of data channels and transmission lines are available.

An alternative to electrical signal transmission can be radio-based transmission, i.e. transmission via electromagnetic waves. However, if electromagnetic waves propagate in all directions in space, the signal power drops quadratically with increasing distance. In a waveguide, on the other hand, electromagnetic signals can ideally be transmitted over long distances in only one dimension, with low losses.

In the present case, a waveguide is understood to mean any, in particular linear, structure which is capable of guiding electromagnetic waves between the end points thereof. In electrical engineering, in particular in telecommunications engineering or high-frequency engineering, waveguides for electromagnetic waves are already sufficiently known.

Electromagnetic signals can consequently be transmitted over long distances via a waveguide, with relatively little effort and comparatively low losses. Waveguides can therefore be advantageously used when high demands are made on the signal transmission bandwidth and/or transmission distance of wired communications.

For further background information, please refer to U.S. Pat. No. 9,490,518 B1, which relates to a waveguide for transmitting high-frequency electromagnetic signals and, in particular, describes the problems associated with low-loss coupling of an antenna arrangement to a dielectric waveguide.

Although signal transmission using a waveguide is essentially advantageous, it has been shown in practice that, at the connecting point at which the electromagnetic signal of an antenna arrangement is coupled to the waveguide (or at which the waveguide is coupled to the antenna arrangement), high signal losses sometimes occur if an installer does not exercise particular care when aligning the waveguide according to the main radiation direction of the antenna arrangement and with regard to impedance matching etc.

In U.S. Pat. No. 9,490,518 B1, the problems becomes clear for example with reference to the coupling of a waveguide to a so-called "Vivaldi" antenna.

It has been shown in practice that, even with very conscientious installation, the signal power can only be coupled into the waveguide to a limited extent since exact positioning of the waveguide in the main radiation direction of the antenna, in particular with time-consuming manual installation, is not usually possible. Even slight positional tolerances of the waveguide with respect to the antenna can lead to notable signal losses.

The conventional manner of installation is therefore also problematic for reasons not the least of which is having a relatively high spatial requirement.

A possible way of facilitating manual installation and reducing coupling losses is disclosed in US Publication No. 2015/0372388 A1. In this case, a printed circuit board plug connector for a dielectric waveguide is proposed, having a housing including a first opening and a second opening, wherein the first opening is designed to accommodate the dielectric waveguide and the second opening is aligned in the direction of an antenna arrangement. The printed circuit board plug connector can be arranged at the edge of a printed circuit board, in the vicinity of an antenna arrangement and a signal converter.

SUMMARY OF THE INVENTION

The present invention is based on the object of providing an improved plug connector for connecting a waveguide to at least one electrical conductor, in which, in particular, simple installation and low coupling losses can be achieved.

The present invention is also based on the object of providing an improved signal processing unit and a system for transmitting high-frequency electromagnetic signals.

The plug connector for connecting a waveguide to at least one electrical conductor comprises a housing for connection to the waveguide, wherein fastening means are provided for the purpose of fixing the housing to a structure having the at least one electrical conductor. The housing is furthermore set up to accommodate a signal converter and an antenna arrangement, wherein a waveguiding arrangement is provided inside the housing which is set up for this purpose, wherein the waveguiding arrangement is arranged and designed to guide an electromagnetic wave into the waveguide and for coupling to the antenna arrangement.

The fastening means or at least some of the fastening means are preferably formed in one piece with the housing of the plug connector. However, it is also conceivable that the fastening means are realized by an adhesive or other known measures. This is illustrated in more detail below.

The housing can have a one-part, two-part or multi-part design. The housing preferably has a two-part design. To this end, it can be provided that the housing has a base and a sleeve. The base is preferably fixed by the fastening means to the afore-mentioned structure having the at least one electrical conductor, for example a printed circuit board or circuit board, having the at least one electrical conductor. The sleeve can be connected to the base using known measures, for example pressed on, soldered or welded. The base is preferably made from metal, for example from die-cast metal, preferably die-cast zinc. The sleeve is preferably made from a plastic material.

In the present case, an electrical conductor is understood to mean a transmission medium which possesses a high density of freely movable charge carriers, for example electrons or ions, and can be used to transmit an electrical current or electrical signals via charge carrier transport. Metals such as silver, copper, aluminium and gold or other materials, such as graphite, for example, are mentioned as examples.

Such an electrical conductor can be arranged on or contained in any structure. For example, an electrical conductor can be an inner conductor and the afore-mentioned structure having the at least one electrical conductor can be the sheath, a dielectric and/or the screen of a cable. An electrical conductor can also be understood to mean a trace on a printed circuit board (PCB) or another conductive component of a printed circuit board, wherein the structure having the at least one electrical conductor can accordingly refer to the printed circuit board or the circuit board itself. The structure having the at least one electrical conductor can also be a device housing.

In contrast to signal transmission using charge carrier transport, the signal transmission in a waveguide takes place using the guided transmission of an electromagnetic wave through the waveguide.

In the present case, a waveguiding arrangement according to the invention refers to one or more waveguide types. The waveguiding arrangement serves for coupling or routing an electromagnetic wave into the waveguide, i.e. into a "cable", in which electromagnetic waveguiding takes place—or vice versa—with the lowest possible losses.

The waveguiding arrangement can preferably be designed as part of the plug connector. To this end, the waveguiding arrangement can be designed, for example, in one piece with the housing or a housing part. However, the waveguiding arrangement can also be designed as a component which is separate from the plug connector and simply be preferably in or on the housing of the plug connector, for example with form fit, force fit or material fit, for the purpose of securing it to the plug connector. In this case, the connection preferably takes place in such a way that the waveguiding arrangement is a fixed part of the plug connector after the connection.

The waveguiding arrangement can have a multi-part design, wherein it can be provided that part of the waveguiding arrangement is formed from parts of the housing.

According to the invention, it can be provided that the waveguiding arrangement for guiding the electromagnetic wave is designed as part of the plug connector or the waveguiding arrangement is part of the one-part or multi-part waveguide and is connected to the housing in a releasable or non-releasable manner.

It is therefore also possible to provide the waveguiding arrangement via the waveguide itself. In this case, it can be provided that the waveguide is accommodated by the housing in a suitable manner and is arranged and designed in such a way that a suitable coupling to the antenna arrangement takes place and the electromagnetic wave from the antenna is introduced or routed into the waveguide via the waveguiding arrangement (in this case as part of the waveguide).

The waveguide can optionally have a one-part or multi-part design. In this case, it is in particular also conceivable that, in the case of a multi-part construction of the waveguide, further connections or extensions are optionally provided outside the housing, which can be realized using known measures.

The plug connector according to the invention can be prefabricated completely with a waveguide. Connection or routing can optionally also take place outside the housing, preferably in the region in which a waveguide plug is plugged to the plug connector according to the invention.

It can be provided that the waveguide plug to be plugged to the plug connector according to the invention is configured in such a way that a section of the waveguide is routed from the waveguide plug, when the waveguide plug is connected to the plug connector according to the invention, and is introduced into the housing of the plug connector. Introduction of the waveguide plug into the housing can preferably take place in such a way that the front end of the routed section of the waveguide contacts the antenna arrangement or is aligned with the antenna arrangement so that an electromagnetic wave can be introduced. In such embodiments, the routed part of the waveguide then represents the waveguiding arrangement. In such embodiments, suitable measures can be taken so that the routed section of the waveguide, which then represents the waveguiding arrangement, is guided and secured in a suitable manner inside the housing.

According to the invention, it can be advantageous if the waveguiding arrangement is designed as part of the plug connector or integrally with the plug connector.

According to the invention, it is provided that the signal converter is connected to the at least one electrical conductor and is set up to carry out conversion between electrical signals and high-frequency electromagnetic signals.

In the present case, electrical signals refer to digital and/or analog signals which are transmitted in electrical conductors by electrical charge transport.

Within the context of the invention, a high-frequency electromagnetic signal is understood to mean signals in the bandpass range with carrier frequencies or mid-band frequencies in the range of 10 to 500 GHz or above, preferably 50 to 200 GHz and particularly preferably 80 to 170 GHz, for example 140 GHz. The frequencies used are not restrictive for the invention.

The signal converter can convert the electrical signals from the baseband to the bandpass range with any carrier frequencies using known modulation techniques.

As a result of the housing being set up to accommodate the signal converter with the antenna arrangement, installation on the structure having the at least one electrical conductor, i.e. a printed circuit board, for example, is fundamentally facilitated. A waveguide can be coupled to an electrical conductor and guided onto the structure having the at least one electrical conductor and/or fixed thereon more quickly and easily than is possible with the known prior art.

The signal delivery or the coupling to the antenna arrangement can take place at a defined delivery point inside the plug connector. The plug connector can therefore already be configured and designed in advance such that the waveguide or the waveguiding arrangement is always placed in the main radiation direction of the antenna arrangement, whereby the highest possible signal power can be coupled into the waveguide or into the waveguiding arrangement.

An installer can treat the plug connector according to the invention in the same manner as a conventional electrical plug connector and place and fix the plug connector at a suitable point on the aforementioned structure having the at least one electrical conductor (i.e. on a printed circuit board or an electrical cable, for example) without time-consuming adjustment and having to take particular care in terms of the handling. The plug connector can be fixed on the structure having the at least one electrical conductor using standard installation techniques. This reduces the processing time or installation time considerably. Furthermore, the installer does not need to have particular experience of dealing with waveguides.

The antenna arrangement can comprise a microstrip line and/or a co-planar waveguide and/or a coaxial structure and/or a differential structure or be designed accordingly.

A patch antenna, Marconi antenna, Vivaldi antenna, dipole antenna or other type of antenna arrangement can be provided. It is essentially possible, within the scope of the invention, to provide any type of antenna arrangement deemed suitable by the person skilled in the art.

The antenna arrangement can be fixed to the signal converter.

The antenna arrangement is preferably part of the signal converter. The antenna arrangement can be arranged on a surface of the signal converter, for example on an upper side, a lateral surface or an underside of an integrated circuit and can have a main radiation characteristic which is aligned accordingly.

However, the antenna arrangement can also simply be arranged close to the signal converter, for example on or in the structure having the at least one electrical conductor.

The housing can be designed as a plastic housing and/or metal housing. A metal housing is preferably provided, which is produced, for example, from die-cast zinc. One housing part is particularly preferably made from metal and a second housing part from plastic material.

The plug connector can be provided or used for connection to a waveguide of any type, in particular for connection to a dielectric waveguide, a hollow conductor or a single-wire waveguide. The plug connector can be particularly preferably used for connecting a dielectric waveguide to at least one electrical conductor.

In one embodiment of the invention, it can be provided that the plug connector is in the form of a printed circuit board plug connector, preferably in the form of a printed circuit board jack, and the structure having the at least one electrical conductor is in the form of a printed circuit board.

A "jack" is understood to mean the female part of a plug connection, which has a housing in which the male part of a plug connector can be inserted.

The plug connector can also be in the form of a printed circuit board plug.

If the plug connector is in the form of a printed circuit board plug connector, the fastening means of the housing can preferably be in the form of metal pins or solder pins or the like, whereby the housing can be pushed through a matching stripboard or through matching holes of the printed circuit board and soldered to solder surfaces (pads) of the printed circuit board, for example on the rear side. A screw connection or adhesive connection to the printed circuit board or a solder connection to the upper side of the printed circuit board is also possible (or another proven installation technique).

If the plug connector is in the form of a printed circuit board plug connector, the housing of the plug connector can be designed for defined electrical components, fixed on the printed circuit board, to be accommodated or comprised therein when the plug connector is fixed on the printed circuit board. In particular, it can be provided that the housing accommodates the signal converter, i.e. that the plug connector or the housing of the plug connector is open on the side facing the printed circuit board and is placed over the desired electrical components or over the signal converter and subsequently fixed to the printed circuit board in such a way that the component or the signal converter is preferably located completely inside the housing.

In an alternative embodiment of the invention, the plug connector can be in the form of a panel plug or panel jack, and the structure having the at least one electrical conductor can be in the form of a device housing.

The housing of the plug connector can be installed on the device housing in a known manner using known fastening means, for example by screwing, riveting, soldering, adhesion or clamping.

The device can be, for example, a computer, a control device, in particular a control device of a motor vehicle, or other signal-processing unit.

In a further embodiment of the invention, it can be provided that the plug connector can be in the form of a plug or coupling, and the structure having the at least one electrical conductor can be in the form of a cable, preferably in the form of a coaxial cable.

In the present case, a "coupling" is understood to be the female part of a plug connector, which is arranged at the end of a cable, for example the coaxial cable.

In an embodiment of the plug connector as a plug or coupling, the fastening means of the housing can be in the form of known connecting means of a plug connector for connection to a cable, for example in the form of clamping means, adhesive surfaces, pressing means or solder surfaces.

A dielectric, a protective sheath, an outer conductor and/or a screen can preferably be used for strain relief or fastening the cable to the plug connector or to the housing of the plug connector.

An electrical cable connected to the plug connector can have one or more inner conductors, which can be the electrical conductors according to the invention. Any number of electrical conductors can be provided in the cable, for example one inner conductor or two, three, four, five, six, seven, eight or more inner conductors. An outer conductor or a screen can also be an electrical conductor within the context of the invention. In addition to electrical signal transmission, signal transmission via wave propagation can, of course, also be provided in the cable, in particular in a coaxial cable.

In a further alternative embodiment of the invention, the plug connector can be in the form of an adapter, and the structure having the at least one electrical conductor can be in the form of an electrical plug connector, preferably in the form of a coaxial plug connector.

The plug connector can therefore be designed to adapt a conventional electrical plug connector electrically and mechanically to switch from an electrical line or electrical signal guidance to electromagnetic wave signal transmission at the connecting point.

In an embodiment of the plug connector as an adapter, the fastening means of the housing can be configured to accommodate the conventional electrical plug connector, for example an electrical plug, an electrical jack or an electrical adapter, and optionally lock the conventional electrical plug connector in place. The so-called "snap-in" technique can be used for this to lock the conventional electrical plug connector in place. A screw connection, such as is customary in D-sub plug connectors, for example, can also be provided. Furthermore, a bayonet closure, for example such as in BNC plug connectors, can also be provided. Adaptations to any electrical plug connectors are possible, wherein the fastening technique(s) of the respective electrical plug connectors can preferably be adopted for the design of the fastening means of the plug connector according to the invention or implemented in a complementary manner.

The housing of the plug connector or the fastening means can have a mechanical coding and/or a magnetic coding using magnetic bodies or magnets so that the conventional electrical plug connectors can only be inserted in a certain position.

In an embodiment of the plug connector as an adapter, it can be provided that the plug connector is capable of accommodating or adapting a conventional electrical plug connector with any number of electrical conductors or inner conductors.

In a further development of the invention, it can be provided that the signal converter, as part of the plug connector, is fixed in the housing.

The signal converter can be fixed in the housing, for example, by adhesion, soldering, clamping or in some other manner.

In particular, if the signal converter is part of the plug connector, a modular component can be produced, which enables particularly simple installation. For example, in an embodiment of the plug connector as a printed circuit board plug connector, the plug connector, together with the signal converter, can then be fixed or installed and electrically connected on the printed circuit board using known installation techniques. The alignment of the antenna arrangement with respect to the waveguiding arrangement can be optimized using this embodiment rendering installation errors almost impossible.

In a further development of the invention, it can moreover be provided that the signal converter has at least one integrated circuit and/or at least one signal circuit board and/or at least one discrete electrical component.

The signal converter is preferably in the form of at least one integrated circuit and/or at least one signal circuit board and/or at least one discrete electrical component.

An electrical component can preferably refer to resistors, capacitors, inductors, memristors, diodes or electrically controlled switches (e.g. transistors).

The signal converter is especially preferably in the form of an integrated circuit, for example in the form of an application-specific integrated circuit (ASIC). Proven and standardized signal converters by any manufacturer can be provided.

Instead of an integrated circuit, a signal circuit board having correspondingly interconnected discrete electrical components can be provided for implementation of the signal converter. A combination of an integrated circuit and discrete electrical components, which are arranged together on a signal circuit board, is also possible. The signal converter can also be in the form of a programmable (digital) circuit, e.g. in the form of a field programmable gate array (FPGA) or programmable logic array (PLA) or can comprise such circuits.

The signal converter is preferably accommodated completely in the housing of the plug connector or surrounded thereby or even encapsulated in the housing.

In a further development of the invention, it can be provided that a supply circuit for the signal converter, as part of the plug connector, is fixed in the housing, wherein the supply circuit has at least one integrated circuit and/or at least one supply circuit board and/or at least one discrete electrical component.

In particular when the signal converter is in the form of an integrated circuit or has an integrated circuit, a supply circuit can be required, for example, for converting signal levels and/or for providing a stable voltage supply.

Signal pre-processing, for example analog-digital conversion or digital-analog conversion etc. can also be provided and can be understood as a supply circuit within the context of the invention.

In a further development of the invention, it can be provided that the waveguiding arrangement for guiding the electromagnetic wave comprises a dielectric waveguide portion and/or a wire waveguide portion and/or a hollow conductor portion and is designed accordingly.

It can be advantageous to design the waveguiding arrangement in the same manner as the waveguide. That is to say, when a dielectric waveguide is provided, it can be advantageous to design the waveguiding arrangement as a dielectric waveguide portion; the same applies analogously for wire waveguide portions and hollow conductor portions.

It has been shown that waveguiding and coupling to the antenna arrangement is possible in a particularly advantageous and low-loss manner when using a dielectric waveguide portion or when the waveguiding arrangement is in the form of a dielectric waveguide portion.

In a further development of the invention, it can be provided that the housing is designed in such a manner that an insertion direction of the waveguide is inclined with respect to a line L which is orthogonal to the contact area A of the housing on the structure having the at least one electrical conductor by 1° to 90°, for example 10° to 80°, 20° to 70°, 30° to 60° or 40° to 50°, preferably 45° or 90°.

An output direction of the waveguide can therefore be provided at any angle. The output angle is preferably selected depending on the available installation space. Certain output angles can moreover be preferred depending on the respective embodiment of the plug connector, the waveguide, the structure having the at least one electrical conductor and/or the antenna arrangement.

In an embodiment of the plug connector as a printed circuit board plug connector, in particular output angles of 45° or 90°, or a housing which is not designed in an angled manner, can be provided. With an output angle of 90°, the waveguide can subsequently be guided laterally away from the printed circuit board and optionally previously guided over part of the circuit board, whereby, for example, (additional) mechanical fastening and/or support of the waveguide on the printed circuit board is possible. A non-angled housing can also be advantageous in the case of a plug connector in the form of a printed circuit board plug connector since the waveguide in this case can be guided away from the printed circuit board orthogonally and therefore in a space saving manner.

Similar or analogous embodiments can be provided for an embodiment of the plug connector as a panel plug or panel jack.

If the plug connector is in the form of a plug, a coupling or an adapter, a non-angled configuration of the housing is conventionally preferred so that an electrical cable can extend substantially linearly from the waveguide since the longitudinal axes of the plug connector according to the invention and the electrical plug connector or the electrical cable substantially coincide or extend in parallel. However, also possible are plugs, couplings and adapters in which the output angle extends at a right angle (or at another angle). The selection of the output angle also depends on the installation situation here and can be determined accordingly by a person skilled in the art.

With an angled configuration of the housing, it can preferably be provided that the (internal) waveguiding arrangement substantially follows the geometry of the housing.

It can be provided that the housing is designed in an angled manner to align the waveguiding arrangement as optimally as possible for coupling to the antenna arrangement without the waveguiding arrangement itself being designed in an angled manner, for example if using an antenna arrangement which radiates laterally.

By using an angled housing, the signal transmission or the coupling of the waveguiding arrangement to the antenna arrangement can be optimized according to the situation.

The housing can preferably be designed such that the insertion direction of the waveguide corresponds to the main radiation direction of the antenna.

In a further development of the invention, it can also be provided that the waveguiding arrangement in the housing is designed in an angled manner for alignment with a main radiation direction of the antenna arrangement and, for example, has a curvature between 1° and 90°, 10° and 80°, 20° and 70°, 30° and 60° or 40° and 50°, preferably of 45° or 90°.

The housing and waveguiding arrangement can therefore be designed in a non-angled or angled manner in each case, wherein any angle is possible in each case.

A plurality of curved portions or inclinations or changes in direction of the housing and/or the waveguiding arrangement are also possible.

The respective geometry and the alignment of the housing and the waveguiding arrangement with respect to one another should be selected for optimizing the coupling to the antenna arrangement and on the basis of the installation situation or the space available. Attention should usually be paid to aligning the waveguiding arrangement in the main radiation direction of the antenna arrangement and subsequently routing the waveguiding arrangement as linearly as possible. The waveguiding arrangement, the insertion direction of the waveguide and the main radiation direction of the antenna arrangement (or the longitudinal axes thereof) are preferably aligned with one another or extend in parallel, for example along a line.

If the waveguiding arrangement is designed in an angled manner or with a curvature, a multi-part waveguiding arrangement, for example a combination of a dielectric waveguide portion and a hollow conductor portion, can be advantageous for enabling undamped waveguiding, with the lowest possible losses.

In particular, when using a dielectric waveguide portion, a screen can be provided on the outer side of the waveguide portion at kink points, angled portions or curved portions of the waveguide portion, for example a metal plating of an outer radius to prevent or at least to reduce signal-power loss or an "escape" of the electromagnetic wave from the guide.

In a further development of the invention, it can also be provided that the plug connector is set up for multi-channel transmission and/or for bidirectional transmission, wherein the waveguiding arrangement, the signal converter and the antenna arrangement are designed to transmit a plurality of high-frequency electromagnetic signals which can be differentiated through the use of different polarization and/or different carrier frequencies and/or defined transmission times and/or spatial separation and/or by a code multiplex method.

If a unidirectional transmission or one-channel transmission is mentioned at any point in this description, or such a transmission is implied, this is, of course, to be understood merely as an example and is only intended to serve for illustrative purposes. The person skilled in the art can optionally provide all embodiments described here for one-channel transmission or multi-channel transmission or unidirectional transmission or bidirectional transmission, unless this is technically impossible.

For example, channel or signal differentiation or bidirectional transmission can be enabled in that a first electromagnetic signal is transmitted using a linearly polarized electromagnetic wave and a second electromagnetic signal is transmitted using a circularly polarized electromagnetic wave.

"Multi-channel" transmission or "bidirectional transmission" on the basis of defined transmission times is understood in particular to mean a time-division multiplex method. In this case, the different electromagnetic signals are transmitted sequentially at defined times in a synchronous or asynchronous manner.

"Spatial separation" is understood to mean that a plurality of electromagnetic waves are transmitted (in parallel) via respectively separate waveguiding means or wave channels (analogously to spatially separate electrical signal transmission in an electrical cable using a plurality of inner conductors). For example, a dielectric waveguide equipped with a plurality of waveguiding means can have a plurality of mutually spatially separate dielectric waveguiding means. To prevent cross-talk between the waveguiding means, the channels can be spaced accordingly and/or an additional screen can be provided between the waveguiding means.

The waveguiding arrangement, the signal converter and the antenna arrangement can be designed accordingly for processing such spatially separate (mutually independent) electromagnetic waves. In particular, in this case, the antenna arrangement and the waveguiding arrangement can have a multi-part design to enable ideal coupling to the individual waveguiding means of the waveguide.

The plug connector can also be designed for connection of an electrical conductor to a plurality of waveguides (analogously to an electrical plug connector which is connected to a plurality of electrical cables). The housing can be designed accordingly for receiving a plurality of waveguides. This configuration is functionally similar to the configuration having a plurality of waveguiding means, which means that the person skilled in the art can also adapt and apply the features above accordingly.

In a further development of the invention, the signal converter can moreover be electrically supplied via at least one of the electrical conductors which also transmits at least one of the electrical signals.

In particular in an embodiment of the plug connector as a plug, coupling or adapter, i.e. when the plug connector is connected to an electrical cable or to an electrical plug connector and is not installed directly on a printed circuit board or in a device, it can be advantageous to keep the number of electrical conductors which lead to the plug connector as small as possible to save on installation space and reduce costs and weight. In this case, one of the inner conductors together with the outer conductor or a further inner conductor of the connected cable can be used, for example, for electrically supplying the signal converter and/or a supply circuit. The corresponding frequency components of the electrical supply, for example an equivalent value, can subsequently be filtered out by the supply circuit or the signal converter to obtain the at least one electrical signal in undisturbed (pure) form.

The supply circuit can preferably be accommodated in the housing of the plug connector or the supply circuit can be part of the plug connector.

Of course, a plurality of electrical signals can thus be modulated accordingly and/or transmitted in a time-separated manner via a single electrical conductor, for example also together with the electrical supply.

The signal converter can be set up to combine a plurality of electrical signals via by converting them into a smaller number of serial high-frequency electromagnetic signals.

In this case, the plurality of electrical signals can be supplied to the signal converter in particular via parallel electrical conductors. It is therefore possible to switch from a (low-frequency) parallel electrical signal transmission to a (high-frequency) serial wave signal transmission, without reducing the data rate.

For example, it can be provided that the signal converter is supplied by five parallel electrical conductors, via which electrical signals, each with a data rate of ten gigabit per second, are transmitted. The signal converter can then be designed to serialise the five parallel electrical signals and, with an at least five times higher frequency, to transmit them electromagnetically in series via the waveguide with a data rate of 50 gigabit per second. The person skilled in the art is able to transfer this simple example to any number of parallel conductors and data rates.

It can be provided that the housing of the plug connector according to the invention is electrically screened and, to this end, comprises in particular a metallic (and conductive) and/or dielectric screen.

The waveguide can also have an electromagnetic screen and/or dielectric screen to prevent or suppress cross-talk or signal disturbances.

A "dielectric screen" is understood to mean that the waveguide, preferably a dielectric waveguide and/or the waveguiding arrangement and/or the housing of the plug connector is surrounded by a dielectric material with a low dielectric constant. For example, a dielectric waveguide and/or a dielectric waveguiding arrangement can have a dielectric constant in the range between 3 and 12, while an advantageous dielectric screen can have a dielectric constant in the range between 2 and 5. The dielectric constant of the screen should preferably be lower than the dielectric constant of the waveguiding means.

A plurality of screens can be provided, which are arranged cascaded or nested, e.g. annularly inside one another. In this case, the screens can also be designed in a mix of metallic and dielectric.

The waveguiding arrangement and/or the waveguiding means of the waveguide can be produced from a polymer, a ceramic, glass or other suitable material.

The connection of the plug connector to the waveguide, or the connection of the waveguiding arrangement to the waveguide, can be realized with the inclusion of a waveguide plug connector, i.e. by a mating connection, or by accommodating a waveguide directly, i.e. a waveguide cut to length.

If a waveguide is to be accommodated directly in the plug connector or is to be connected to the waveguiding arrangement for routing the electromagnetic wave, any connection type, for example using form fit, force fit or material fit, can be provided. For example, a crimp connection or crimp sleeve can be provided for accommodating the waveguide. It is also possible to connect the waveguide to the plug connector or the housing of the plug connector and/or to the waveguiding arrangement of the plug connector by clamping, adhesion, pressing or welding.

A pre-fabricated connection cable (pigtail) can preferably also be provided for connection to the plug connector.

The plug connector according to the invention is preferably designed to be connected to a waveguide plug connector. In this case, it can be provided that the plug connector according to the invention is designed to accommodate a waveguide plug or to be inserted into a waveguide coupling.

The waveguide plug connector and the plug connector according to the invention can be locked using known measures after the mating connection; in particular locking means can be provided, which are known for connecting a plug to a jack; in particular this can refer to a screw connection, a bayonet connection, a lever mechanism or other locking means. Locking with the aid of a latching groove and a latching hook may also be especially suitable for this.

The plug connector according to the invention can have, at the connecting point to a waveguide plug connector, all known features of a plug connector such as mechanical or magnetic locking, strain relief, screening, coding etc.

According to the invention, it can be provided that the housing is at least partially surrounded by an electromagnetic screen for the purpose of reducing or preventing the electromagnetic screen, wherein the electromagnetic screen is preferably electrically conductively connected to a metallic region of the housing or a metallic housing part.

The electromagnetic screen is intended to prevent electromagnetic radiation from escaping the housing or the plug connector, which might be the case in particular when the waveguide has not been coupled-in correctly in certain circumstances. The electromagnetic screen preferably surrounds the housing over a certain length, preferably completely, and is electrically connected to the housing.

In a simple embodiment, the electromagnetic screen can be realized in that the housing is surrounded by a sleeve, a so-called "EMC" (electromagnetic compatibility) sleeve. In this case, the sleeve can be formed from an electrically conductive material, preferably metal.

If the plug connector according to the invention is provided for connection to a printed circuit board, it is advantageous if the electromagnetic screen is connected to a so-called "ground layer" of the printed circuit board or an "earth point". This can be easily achieved in that the electromagnetic screen is connected to a correspondingly designed section of the housing in a suitable manner. For example, the electromagnetic screen can be connected to a base element or base of the housing, which is produced from die-cast zinc and is in turn connected to an earth point or the ground layer of the printed circuit board. The base of the housing can preferably accommodate the signal converter.

In a preferably provided embodiment, the housing has a two-part or multi-part design. In this case, a base of the housing is preferably formed to be electrically conductive, preferably from metal, for example from a die-cast metal, in particular die-cast zinc. Part or further parts of the housing can be formed from an electrically non-conductive material, for example a plastic material. The electromagnetic screen is especially suitable for the housing parts formed from plastic material or an electrically non-conductive material. In this case, the electromagnetic screen can preferably be connected to the electrically conductive housing part, for example the base, to provide a continuous screen. An arrangement of this type is suitable for all embodiments.

The electromagnetic screen can also be achieved in that the housing is at least partially, preferably completely, metallically coated, in particular in the regions in which the housing or the housing parts is or are designed to be non-metallic. This can take place for example by vapor deposition. In this case, it can in turn be provided that an electrical connection to a metallic part of the housing and/or the ground layer and/or an earth point is produced. Furthermore, it is essentially also possible to apply a metal foil in a suitable manner to the housing, in particular the housing parts which are not electromagnetically screened.

An electromagnetic screen can preferably also be realized in that a plug of the waveguide or a cable plug, which is connected to the housing of the plug connector according to the invention in a known manner, is formed with an electromagnetic screen in such a way that the housing of the plug connector according to the invention is at least partially electromagnetically screened when the waveguide plug is connected to the plug connector according to the invention. A conductive connection to an earth point or the ground layer or to part of the housing which is metallically formed can take place using known measures, for example via contact springs.

The invention also relates to a signal processing unit having a plug connector according to the embodiments above and having a structure having the at least one electrical conductor.

In the present case, a "signal processing unit" is understood to mean an electrical component such as, for example, a computer, a control device, in particular a control device in a motor vehicle, or any further processing unit. A signal processing unit of this type frequently has at least one printed circuit board, an electrical cable connection or an electrical cable and/or an electrical plug connector.

In a further development of the signal processing unit, it can be provided that a signal converter is fixed on the structure having the at least one electrical conductor and is accommodated in a housing of the plug connector when the plug connector is fixed on the structure having the at least one electrical conductor. Alternatively, the signal converter can also be integrated in the housing.

The invention further relates to a system for transmitting high-frequency electromagnetic signals, comprising
   a first signal processing unit according to the description above,
   a second signal processing unit having a second plug connector, and
   a waveguide,
   wherein at least one high-frequency electromagnetic signal can be transmitted between the two signal processing units via the waveguide.

The second signal processing unit can be any signal processing unit. However, the second signal processing unit is preferably also equipped with features described above, i.e. in particular the plug connector according to the invention.

Features and advantages which have already been described in relation to the plug connector can also be transferred to the signal processing unit and the system, and vice versa. The description of the invention should be understood accordingly.

The system according to the invention is suitable for high-frequency signal transmission or for signal transmission with high data rates across the entire field of electrical engineering or communications engineering.

For example, signals can be transmitted between two printed circuit boards and/or or signals can be transmitted between two signal processing units, for example two computers or two control devices.

The signal transmission via the waveguide can be provided over short distances or long distances. The electromagnetic signals via the waveguide can even be transmitted over distances which are smaller than ten centimeters (<10 cm) and also greater than one hundred meters (>100 m). The electromagnetic signals are preferably transmitted via the waveguide over a length of ten centimeters to one hundred meters (10 cm to 100 m), for example over a distance greater than fifty centimeters (>50 cm), greater than one meter (>1 m), greater than two meters (>2 m), greater than three meters (>3 m), greater than four meters (>4 m), greater than five meters (>5 m), greater than ten meters (>10 m), greater than twenty meters (>20 m), greater than thirty meters (>30 m), greater than forty meters (>40 m) or greater than fifty meters (>50 m).

The transmission via the waveguide can be interrupted by further plug connectors. This means that provision can also be made to extend a waveguide within the system by joining a plurality of waveguides together using plug connectors.

The plug connector according to the invention, the signal processing unit according to the invention and the system according to the invention can be advantageously used across the entire field of electrical engineering. In this case, a particularly preferred application field relates to aerospace engineering and vehicle engineering (land vehicles, water vehicles and air vehicles). High-frequency electromagnetic signals can particularly preferably be transmitted with high data rates between control devices of vehicles, for example motor vehicles.

The waveguide can be any known waveguide. The plug connector according to the invention is suitable for all known waveguides.

A dielectric waveguide portion and/or a dielectric waveguiding means of the waveguide can have a rectangular, square, trapezoidal, cylindrical, oval or any other cross-section.

The cross-section of a dielectric waveguiding means or the dielectric waveguide portion can change over the length of the dielectric waveguide or the dielectric waveguide portion, for example to perform impedance matching.

Exemplary embodiments of the invention are described in more detail below with reference to the drawings.

The Figures each show preferred exemplary embodiments, in which individual features of the present invention are illustrated in combination with one another. Features of an exemplary embodiment can also be implemented separately from the other features of the same exemplary embodiment and can therefore be readily combined with features of other exemplary embodiments by a person skilled in the art to give further useful combinations and sub-combinations.

Functionally identical elements are provided with the same reference signs throughout the specification description of the Figures.

DETAILED DESCRIPTIONS OF PREFERRED EMBODIMENTS

The exemplary embodiments according to FIGS. 1, 2, 5 and 6 show plug connectors 1 according to the invention with so-called "active solutions" for signal processing. The exemplary embodiments according to FIGS. 3 and 4 show plug connectors 1 according to the invention with so-called "passive solutions" for signal processing.

Figure 5:
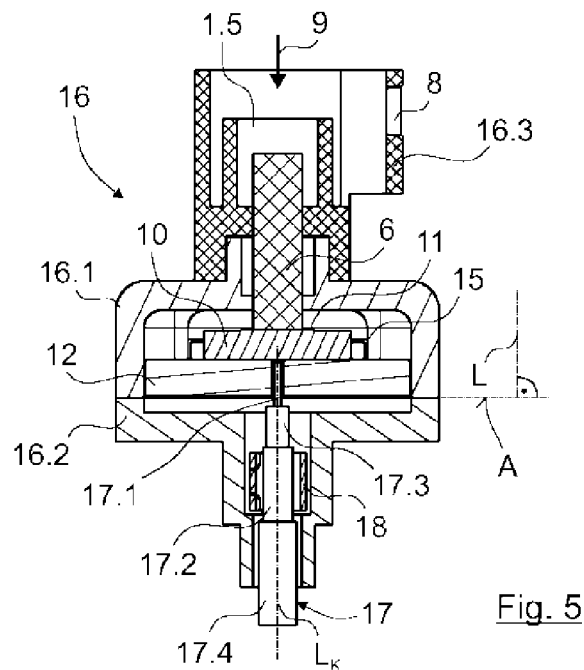
FIG. 5 is a sectional illustration which shows, schematically, an embodiment of a plug connector and in which the plug connector forms a coupling.
Figure 8:
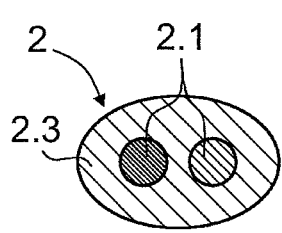
FIG. 8 is a cross-sectional view which shows, schematically, a waveguide in an embodiment with two waveguiding means.
Figure 9:
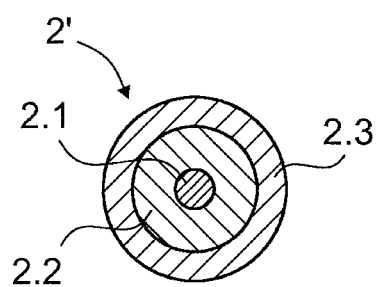
FIG. 9 is a cross-sectional view which shows, schematically, a waveguide of a further embodiment.

The plug connectors according to the invention serve, in all embodiments, for connecting a waveguide 2, 2' in particular a waveguide cable, to at least one electrical conductor, wherein the electrical conductors to be connected are only illustrated in FIG. 5 for reasons of clarity. However, the person skilled in the art is familiar with how corresponding electrical conductors in the other embodiments are realized. An example of a waveguide 2 having two waveguiding means 2.1 is schematically shown in FIG. 8 and a waveguide 2' having a single waveguiding means 2.1 is schematically shown in FIG. 9.

Figure 1:
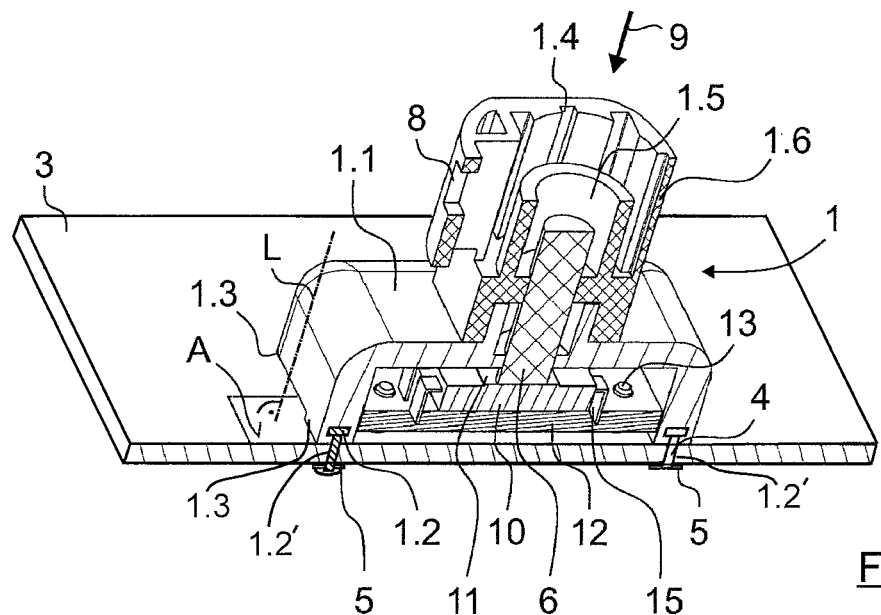
FIG. 1 is a sectional isometric illustration which shows, schematically, a first embodiment of a plug connector and in which the plug connector is in the form of a printed circuit board jack with a straight output of the housing.

In FIG. 1, a first embodiment of a plug connector 1 according to the invention is shown in a sectional isometric illustration. In this embodiment, the plug connector 1 is in the form of a printed circuit board jack and is provided with an electrical conductor (not illustrated) on a printed circuit board 3 for connection to a waveguide 2, 2'.

The plug connector 1 of the embodiment of FIG. 1 has a two-part housing, which is composed of a base 1.1 and a sleeve 1.6. A one-part housing, in particular made from metal and/or plastic material, or a multi-part housing, can alternatively also be provided. All exemplary embodiments are to be understood accordingly.

In the exemplary embodiment, it is provided that the base 1.1 and the sleeve 1.6 are non-releasably connected to one another, for example in that the sleeve 1.6 is connected to the base 1.1 by pressing-in, screwing, soldering or welding. Guide rails and/or guide grooves 1.4 can also be provided on the sleeve 1.6.

The base 1.1 is preferably formed from an electrically conductive material, preferably metal, particularly preferably a die-cast metal and especially preferably die-cast zinc. The base 1.1 can also serve in a known manner as an outer conductor. However, this is not provided in the exemplary embodiments. The sleeve 1.6 is preferably formed from an electrically non-conductive material or a plastic material. The invention is not restricted to the base 1.1 and the sleeve 1.6 being formed from certain materials. The above-mentioned configuration is nevertheless particularly suitable and is preferably provided accordingly for all embodiments.

The description of the exemplary embodiments should essentially be understood such that, instead of the two-part housing illustrated, a one-part or multi-part housing can also be used. In this case, the features which are illustrated in relation to the base 1.1 and the sleeve 1.6 and which are together referred to as the "housing", can also be applied analogously to a one-part housing or a multi-part housing. In particular, in this case, the feature "base" 1.1 and the feature "sleeve" 1.6 are replaced by the feature "housing".

The base 1.1 comprises fastening means 1.2 for fixing it to the printed circuit board 3. In the embodiment illustrated in FIG. 1, the fastening means 1.2 are metal pins 1.2' which are pushed through corresponding holes 4 in the printed circuit board 3 and can be fixed to corresponding solder surfaces 5 on the rear side of the printed circuit board 3 by soldering.

For better illustration, only one of the metal pins 1.2' in the plug connector 1 is shown in FIG. 1, whereby one of the holes 4 of the printed circuit board 3 can be seen more clearly.

Any (further) fastening means can be provided. For example, the base 1.1 can also be connected to the upper side of the printed circuit board 3 by adhesion.

Figure 2:
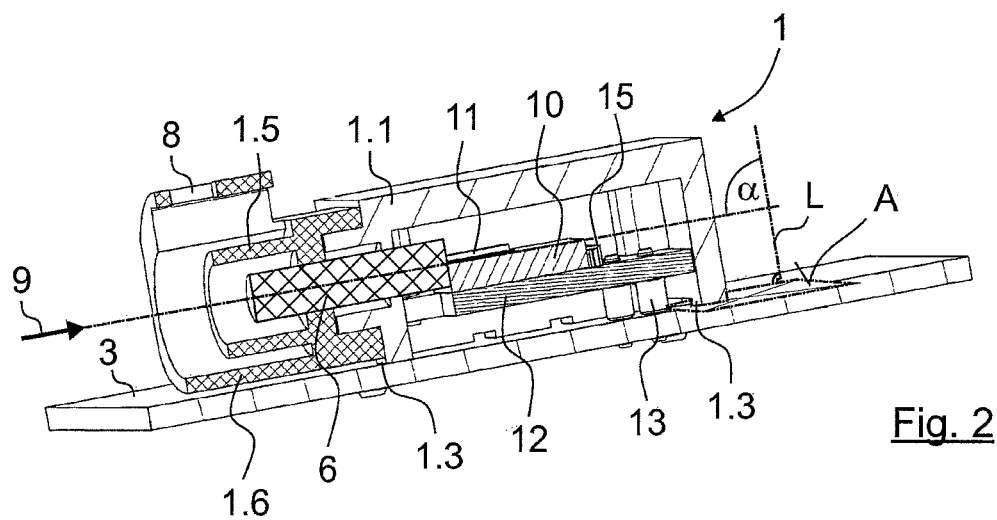
FIG. 2 is a sectional isometric illustration which shows, schematically, a second embodiment of a plug connector and in which the plug connector is in the form of a printed circuit board jack with an angled output of the housing.
Figure 3:
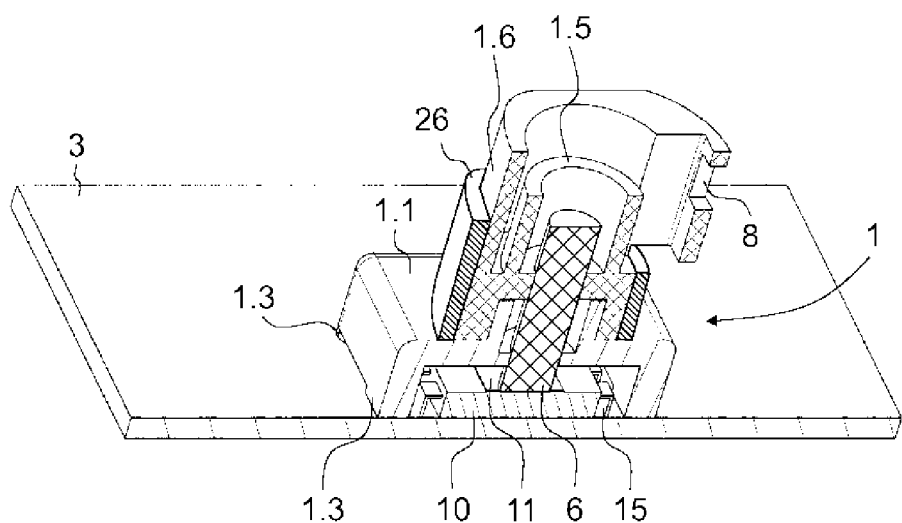
FIG. 3 is a sectional isometric illustration which shows, schematically, a third embodiment of a plug connector and in which the plug connector is in the form of a printed circuit board jack with a straight output of the housing.
Figure 4:
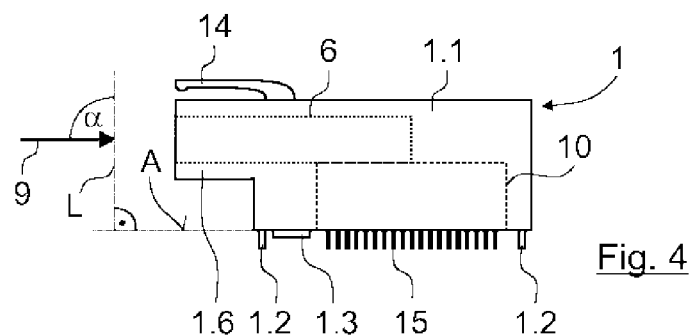
FIG. 4 is a side view which shows, schematically, a fourth embodiment of a plug connector and in which the plug connector forms a printed circuit board jack with an angled output of the housing.

Suitable or corresponding fastening means 1.2 for fixing the base 1.1 in place are also provided in the embodiments according to FIGS. 2 to 4 (not illustrated by way of example in FIGS. 2 and 3).

Spacers 1.3 can be provided to distance the base 1.1 at least partially from the printed circuit board 3 or to reduce the contact area A of the base 1.1 on the printed circuit board 3. Air gaps can thus arise between the base 1.1 and the printed circuit board 3, which serve, for example, for cooling the interior of the base 1.1 or the sleeve 1.6 and/or prevent undesired contact with traces of the printed circuit board 3. The spacers 1.3 can be formed out of the base 1.1 in the manner of webs. The spacers 1.3 and/or the fastening means 1.2 can also serve to produce an electrical connection between the base 1.1 and the printed circuit board 3, in particular a ground layer or an earth point of the printed circuit board 3.

The base 1.1 furthermore comprises a waveguiding arrangement 6 for guiding an electromagnetic wave into the waveguide 2. The waveguiding arrangement 6 is in the form of a dielectric waveguide portion in the exemplary embodiment. However, waveguiding arrangement 6 can also be provided as a wire waveguide portion or a hollow conductor portion or a combination of a wire waveguide portion and a hollow conductor portion. The exemplary embodiments are to be understood accordingly.

Figure 7:
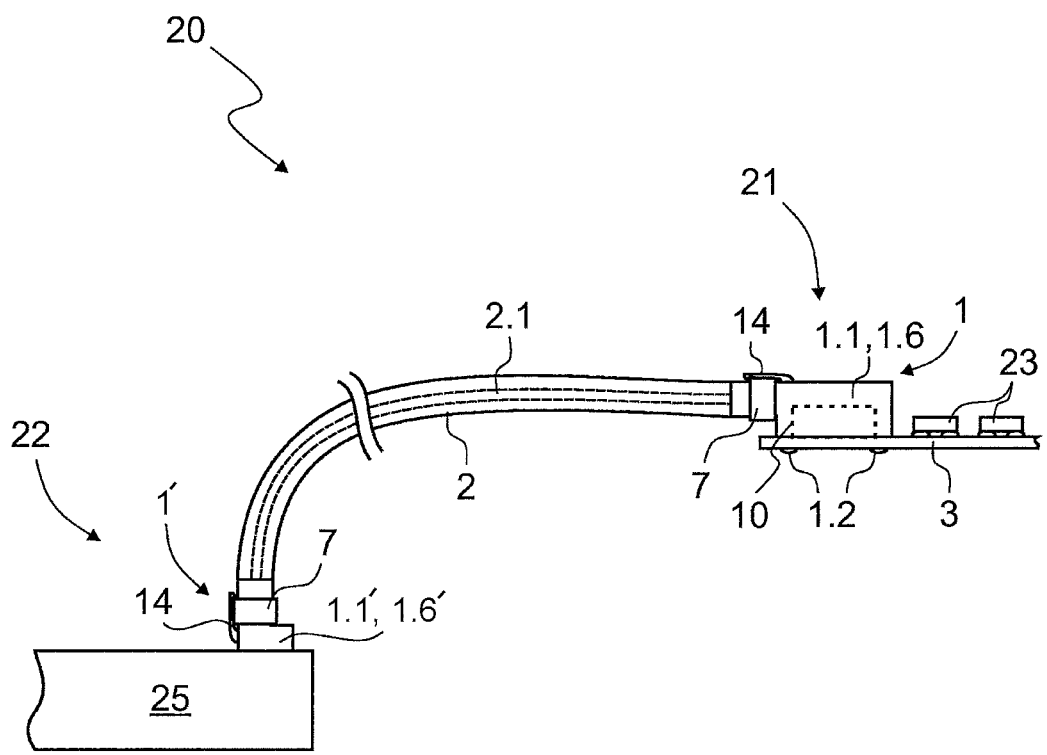
FIG. 7 is a schematic illustration which shows, schematically, an embodiment of a system with two signal processing units and a waveguide.

In the exemplary embodiments, it is provided that the waveguiding arrangement 6 is designed as part of the plug connector 1. However, alternatively the waveguiding arrangement 6 can also be part of a one-part waveguide 2 as schematically shown in FIGS. 7 and 8 or a multi-part waveguide 2', examples of which are schematically shown in FIG. 9, and be connected to the housing in a releasable or non-releasable manner. The waveguiding arrangement 6 can optionally also be formed in a waveguide plug 7 as described in more detail below with respect to FIG. 7, or the waveguide plug 7 can route a section of the waveguide 2 in such a way that, when the waveguide plug 7 is connected to the plug connector according to the invention, a section of the waveguide 2 penetrates into the housing.

Therefore, the waveguiding arrangement 6 does not necessarily have to be part of the plug connector 1. The waveguiding arrangement 6 can also be provided by the waveguide 2, 2'. All exemplary embodiments should be understood such that the waveguiding arrangement 6 can be designed as part of the plug connector, but can also be provided by the waveguide 2, 2', examples of which are schematically shown in FIGS. 7, 8 and 9.

The sleeve 1.6 is designed to produce a connection with a waveguide plug 7 (see for example FIG. 7). In this case, the specific geometry of the sleeve 1.6, and optionally also the base 1.1, is adapted to the corresponding waveguide plug 7 in order to accommodate the waveguide plug 7 therein and/or to enable insertion of the waveguide plug 7. To this end, the housing, in particular the sleeve 1.6 of the housing, is preferably mechanically and/or magnetically coded, whereby only a certain waveguide plug 7 can be inserted, and also only in a certain orientation. Guide rails and/or guide grooves 1.4 can also be provided on the sleeve 1.6. The sleeve 1.6 furthermore has a latching groove 8 in which a latching hook of a waveguide plug 7 (as schematically shown in FIG. 7) can latch. In this case, the waveguiding arrangement 6 or the dielectric waveguide part is aligned in such a way that it is capable of routing the guided electromagnetic wave with the lowest possible signal losses directly into the waveguide 2 or the waveguide plug 7 or a waveguiding arrangement of the waveguide 2 or the waveguide plug 7.

The housing formed by the base 1.1 and the sleeve 1.6 is designed such that it is not angled in the embodiment according to FIG. 1 and has a straight output direction. In this case, the insertion direction 9 in which the waveguide plug 7 is inserted into the sleeve 1.6 extends parallel to a line L which is orthogonal to the contact area A of the base 1.1 on the printed circuit board 3. In FIGS. 1, 2, 4, 5, and 6 insertion direction 9 is denoted by an arrow.

The waveguiding arrangement 6 in the embodiment according to FIG. 1 extends linearly or in a straight line through the base 1.1 and the sleeve 1.6.

In the exemplary embodiments of the base 1.1, the housing is furthermore set up to accommodate a signal convertor 10 having an antenna arrangement 11. In this case, the signal converter 10, as part of the plug connector 1 in the form of a printed circuit board jack, is preferably fixed indirectly in the base 1.1 or is part of the printed circuit board jack. The signal converter 10 can also be arranged at another point of the housing.

In the embodiment of FIG. 1, the antenna arrangement 11 is part of the signal converter 10 and arranged on the upper side of the signal converter 10, wherein the main radiation direction of the antenna arrangement 11 is aligned with the waveguiding arrangement 6. The waveguiding arrangement 6 in the housing is therefore arranged and designed for optimum coupling with the antenna arrangement 11.

In the exemplary embodiment, the signal converter 10 is designed as an application-specific integrated circuit. The signal converter 10 can essentially have at least one integrated circuit and/or at least one signal circuit board and/or at least one discrete electrical component. The signal converter 10 is connected to the at least one electrical conductor on the printed circuit board 3 and set up to carry out a conversion between electrical signals and high-frequency electromagnetic signals.

In the embodiment of FIG. 1, a supply circuit 12 for the signal converter 10, as part of the printed circuit board jack, is fixed in the base 1.1. Alternatively, an arrangement at any other point in the housing, i.e. also in the sleeve 1.6 in the exemplary embodiments, is possible. The supply circuit 12 preferably has a supply circuit board and a plurality of discrete electrical components (not illustrated). In the exemplary embodiment, the supply circuit 12 is connected to the base 1.1, for example by clamping or adhesion, and has electrical connections 13 to the printed circuit board 3 and therefore to the at least one electrical conductor. As a result of the signal converter 10 being fixed on the supply circuit 12 and being electrically connected to the supply circuit 12, the signal converter 10 is therefore also fixed to the base 1.1 of the printed circuit board jack. The signal converter 10 is furthermore electrically connected to the at least one electrical conductor of the printed circuit board 3 via the electrical connection to the supply circuit 12, for which electrical contacts 15 can be provided.

The supply circuit 12 is also fixed to the printed circuit board 3 via the electrical connections 13. The electrical connection can therefore, at the same time, be fastening means of the supply circuit 12. The electrical connections 13 or fastening means of the supply circuit 12 can also be used as spacers of the supply circuit 12.

Even if this is not illustrated in the exemplary embodiment, the waveguiding arrangement 6 and the antenna arrangement 11 can also each have a multi-part design for guiding a plurality of spatially separate electromagnetic signals. The printed circuit board jack can also be provided for connection to a plurality of waveguides 2 or to a waveguide 2 having a plurality of waveguiding means 2.1 (see for example FIG. 8).

The plug connector 1 can therefore essentially be set up for multi-channel transmission and/or for bidirectional transmission. In this case, a plurality of high-frequency electromagnetic signals can be transmitted, for example using different polarisation polarization and/or different carrier frequencies and/or defined transmission times.

A metallic and/or dielectric screen 1.5 can also be provided, which is formed for example by the base 1.1 and/or the sleeve 1.6. The screen 1.5 can extend annularly around the waveguiding arrangement 6 and extend over, or beyond, the length thereof.

In FIG. 2, a second embodiment of a plug connector 1 of the invention is illustrated, which is essentially similar to the embodiment of FIG. 1, but which here shows a plug connector 1 in the form of a printed circuit board jack in which the housing has an angled output. In this case, repeated description of identical or essentially similar components is omitted where possible. All features which have been described in relation to FIG. 1 can also be transferred to all other exemplary embodiments without necessitating explicit mention in this regard. It is substantially the differences which will be discussed in detail below; this also applies for subsequent figures.

In contrast to the embodiment of FIG. 1, the base 1.1 and the sleeve 1.6 of the embodiment of FIG. 2 are configured to form an angle α between the insertion direction 9 (or the extension thereof) and a line L which is orthogonal to the contact area A of the base 1.1 on the printed circuit board 3. In the exemplary embodiment according to FIG. 2, the angle α is preferably 90°. Any angle can essentially be provided.

A housing having an angled output direction can be advantageous for several reasons. Firstly, geometrical restrictions or specifications can dictate a corresponding output direction. It can also be ultimately advantageous for the waveguide 2 to be routed flat against the printed circuit board 3, whereby the waveguide 2 can be additionally supported and secured. Last but not least, it can be advantageous to make sure that the waveguiding arrangement 6 is aligned in a main radiation direction of the antenna arrangement 11 and to thereby achieve the best possible coupling.

In the embodiment of FIG. 2, the main radiation direction of the antenna arrangement 11 extends laterally away from the signal converter 10. As a result of the housing being designed to be angled through 90°, the waveguiding arrangement 6 can still extend linearly. A linear progression of the waveguiding arrangement 6 is preferable since this ideally means that damping does not occur or signal power losses do not occur. The main radiation direction of the antenna arrangement 11 therefore extends contrary to the insertion direction 9 along the longitudinal axis of the waveguiding means 6.

It can alternatively also be provided that the housing is designed such that it is not angled, wherein the waveguiding arrangement 6 has a curvature (not illustrated), in order to be optimally aligned to the main radiation direction of the antenna arrangement 11 and to guide the electromagnetic wave optimally between the waveguide 2 and the antenna arrangement 11.

FIG. 3 shows a further embodiment of a plug connector 1 in the form of a printed circuit board jack having a non-angled housing, consisting of the base 1.1 and the sleeve 1.6. In contrast to the embodiments of FIGS. 1, 2, 5 and 6, a supply circuit 12 is not provided in the embodiment of FIG. 3. The signal converter 10 is furthermore not fixed to the base 1.1, but to the printed circuit board 3. However, in the embodiment of FIG. 3, the antenna arrangement 11 of the signal converter 10 and the waveguiding arrangement 6 are aligned optimally with one another since the base 1.1 and the signal converter 10 each assume a fixedly defined position on the printed circuit board 3. The fixedly defined position of the antenna arrangement 11 of the signal converter 10 and the waveguiding arrangement 6 can preferably be specified by the stripboard or the holes 4 or vias of the printed circuit board 3 in the manner illustrated in FIG. 1.

By way of example, an electromagnetic screen 26 is shown in FIG. 3, which screen surrounds the sleeve 1.6 of the housing at least over part of its length, preferably over the entire length. The electromagnetic screen 26 of this type can be provided analogously in all embodiments. Although this is optional, it improves the electromagnetic compatibility of the plug connector according to the invention. The electromagnetic screen 26 can be used alternatively or additionally to the metallic and/or dielectric screen 1.5, which was described in relation to the embodiment according to FIG. 1 and which could essentially likewise be used in all embodiments.

The electromagnetic screen 26 can be configured in such a way that it surrounds, in particular, the electrically non-conductive parts of the housing, in particular the parts of the housing which are not metallically formed. The electromagnetic screen 26 can, however, essentially also be configured in such a way that the housing as a whole, i.e. the base 1.1 and the sleeve 1.6 in the present case, are surrounded. This configuration is particularly suitable when the base 1.1 is not already configured in such a way that the base 1.1 ensures an electromagnetic screen 26, i.e. in particular when the base 1.1 is not formed from metal. If the housing has a one-part or multi-part design, the optionally provided electromagnetic screen 26 can be adapted accordingly.

In the exemplary embodiment according to FIG. 3, the electromagnetic screen 26 is in the form of a sleeve made from an electrically conductive material, metal in the exemplary embodiment. In this case, the sleeve which forms screen 26 is preferably electrically connected conductively to a ground layer of the printed circuit board 3 or an earth point. In the exemplary embodiment, the connection takes place in that the sleeve which forms screen 26 is electrically connected conductively to a base 1.1. In this case, the base 1.1 of the housing is preferably produced from die-cast zinc.

Alternatively or additionally to a sleeve design, the electromagnetic screen 26 can preferably also be achieved by at least partially metallically coating, and preferably by completely metallically coating, the parts of the housing to be electromagnetically screened. This can preferably take place by vapor deposition. The sleeve 1.6 and/or the base 1.1 can furthermore also be provided with a metal foil.

The electromagnetic screen which forms screen 26 can preferably also be achieved in that a waveguide plug 7 (illustrated schematically in FIG. 7) has a configuration which, if the waveguide plug 7 is connected to the plug connector 1 according to the invention, is suitable for providing an electromagnetic screen for the plug connector 1 according to the invention. To this end, it can be provided that the waveguide plug 7 accordingly surrounds at least one part of the housing formed by the base 1.1 and the sleeve 1.6 of the plug connector 1 according to the invention. To this end, the waveguide plug 7 can be provided with a suitable electromagnetic screen, for example constructed as a sleeve. In this case, it is provided that the electromagnetic screen of the waveguide plug 7 preferably produces an electrically conductive connection to an earth point or a ground layer of the printed circuit board 3, optionally via the base 1.1 of the housing formed by the base 1.1 and the sleeve 1.6. Contact springs can be provided for this purpose. Alternatively, other known measures can also be provided.

FIG. 4 schematically illustrates a side view of a fourth embodiment of a plug connector 1 in which the plug connector 1 is in the form of a printed circuit board jack with an angled housing form (again with an angle α of 90°). Inside, the waveguiding arrangement 6 and the signal converter 10 are merely illustrated schematically by dashed lines. A supply circuit 12 is not provided in the embodiment of FIG. 4. The signal converter 10 is fixed in the base 1.1. The sleeve 1.6 has a snap hook 14. Lateral fastening means 1.2 are provided on the base 1.1. Electrical contacts 15 of the signal converter 10 serve for connection to the printed circuit board 3. Spacers 1.3 again ensure that the base 1.1 does not lie completely flat on the printed circuit board 3. The electrical contacts 15, the signal converter 10 and the spacers 1.3 can be seen in FIG. 4. The printed circuit board 3 is not shown in FIG. 4.

A further embodiment of the invention is illustrated in FIG. 5. The plug connector according to the invention is shown in the form of a coupling 16 of a coaxial cable 17. In this case, the coupling 16 according to the invention, with its housing which is formed by a base 16.1 and a sleeve 16.3, accommodates the coaxial cable 17 and is fixed thereto. The coaxial cable 17 comprises an electrical inner conductor 17.1, and an electrical outer conductor 17.2, which are separated by a dielectric 17.3. An insulating outer sheath 17.4 sheaths the coaxial cable 17. As the fastening means, a crimp sleeve 18 or other fastening means is provided, which ensure(s) adequate securing of the coaxial cable 17 on the coupling 16. In the present case, the crimp sleeve 18, with the coaxial cable 17, is accommodated in a connecting part 16.2. The connecting part 16.2 therefore has the coaxial cable 17 with the inner electrical conductor 17.1 and the outer electrical conductor 17.2 and can be referred to as the "structure having the at least one electrical conductor." The connecting part 16.2 in the present case serves for improved fastening of the coaxial cable 17 to the coupling 16 and can be connected to the base 16.1 by adhesion, for example. However, the coaxial cable 17 can also be fastened directly to the base 16.1 and, in this case, represents the structure having the at least one electrical conductor.

The coupling 16 comprises a signal converter 10, which is electrically and mechanically connected to a supply circuit 12. The supply circuit 12 is connected to the base 16.1 of the coupling 16 and fixed thereto. A waveguiding arrangement 6 is again aligned with an antenna arrangement 11 of the signal converter 10. The base 16.1 and the sleeve 16.3 are not designed in an angled manner, wherein the insertion direction 9 of the waveguide 2 extends parallel to the longitudinal axis $L_K$ of the coaxial cable 17. The signal converter 10 and the supply circuit 12 are accommodated preferably completely by the base 16.1 of the coupling 16.

A single-core coaxial cable 17 is illustrated in the exemplary embodiment. However, any cable with any number of inner conductors can be provided.

An electrical supply to the signal converter 10 and/or the supply circuit 12 can be provided via at least one of the electrical conductors, the inner conductor 17.1 and the outer conductor 17.2 of the coaxial cable 17 in the present case, wherein the coaxial cable 17 also transmits at least one of the electrical signals.

Figure 6:
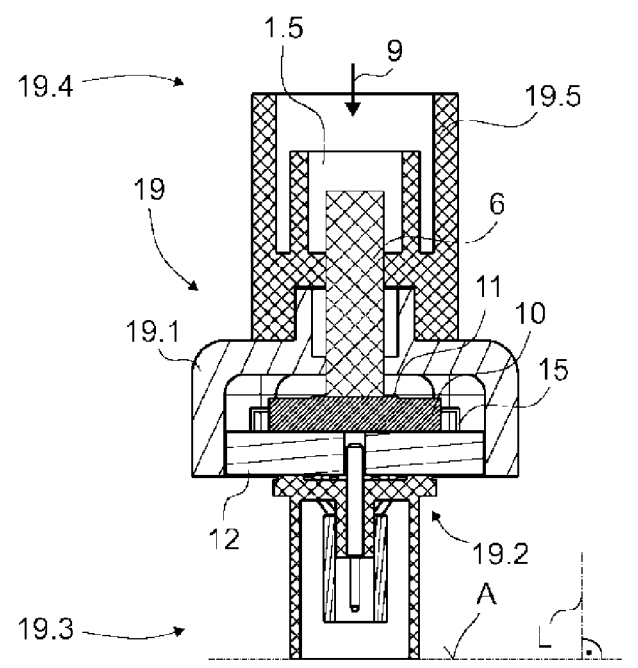
FIG. 6 is a sectional illustration which shows, schematically, an embodiment of a plug connector and in which the plug connector forms an adapter.

A further embodiment of the plug connector according to the invention is shown in FIG. 6. In FIG. 6, the plug connector according to the invention is in the form of an adapter 19. The housing of the adapter 19, which is formed by a base 19.1 and a sleeve 19.5, has fastening means 19.2 for fixing the adapter 19 to a coaxial plug (not illustrated). The adapter 19 comprises, on the one hand, a jack part 19.3 for a conventional electrical coaxial plug and, on the other, a jack part 19.4 for connection to a waveguide plug 7 as schematically illustrated in FIG. 7 or any connection for a waveguiding means such as a one-part waveguide 2 as schematically shown in FIGS. 7 and 8 or a multi-part waveguide 2' as schematically shown in FIG. 9, respectively. Of course, adaptation of any electrical plug connector to any waveguide plug connector can be provided by the adapter according to the invention.

FIG. 7 shows a system 20 for transmitting high-frequency electromagnetic signals. The system 20 comprises a first signal processing unit 21, a second signal processing unit 22 and a waveguide 2. A high-frequency electromagnetic signal can be transmitted between the first signal processing unit 21 and the second signal processing unit 22 via the waveguide 2. An individual waveguiding means 2.1 is indicated by dashed lines in the waveguide 2.

In the system 20 of FIG. 7, the first signal processing unit 21 comprises a first plug connector 1 according to the description above and a structure, namely a printed circuit board 3 which has at least one electrical conductor (the at least one electrical conductor not illustrated in FIG. 7).

As shown in FIG. 7, the first plug connector 1 of the first signal processing unit 21 is in the form of a printed circuit board jack which is arranged on the printed circuit board 3 and has a housing having a base 1.1 and a sleeve 1.6. The printed circuit board 3 has at least one integrated circuit and/or at least one discrete electrical component 23. By way of example, two discrete electrical components 23, as SMD (Surface Device) components, are illustrated in FIG. 7. The plug connector 1 of FIG. 7 is equipped with fastening means 1.2, which can be pushed through the printed circuit board 3 and soldered to a rear side of the printed circuit board 3.

The second signal processing unit 22 comprises a second plug connector 1' which is in the form of a panel jack 24, which is fixed in or is fixed on a device housing 25 of the second signal processing unit 22. As shown in FIG. 7, the second plug connector 1' has a housing formed by a respective base 1.1' and a respective sleeve 1.6'.

It can be provided that a respective signal converter 10 is fixed on the respective structure having the at least one electrical conductor, namely, the printed circuit board 3 of the first signal processing unit 21 and the device housing 25 of the second signal processing unit. 22. A respective signal converter 10 is accommodated in the housing formed by the base 1.1, and the sleeve 1.6 of the first plug connector 1 or the housing formed by the base 1.1' and the sleeve 1.6' of the second plug connector 1' when the first plug connector is fixed on the printed circuit board 3 and the second plug connector 1' is fixed on the device housing 25. Alternatively, the respective signal converter 10 can also be fixed in, or be part of, the respective housing formed by base 1.1 and sleeve 1.6 of the first signal processing unit 21 or the respective housing formed by the base 1.1' and sleeve 1.6' of the second signal processing unit 22.

FIG. 8 shows a cross-section of a dielectric waveguide 2, which is designed for spatially separated multi-channel transmission. To this end, the waveguide 2 has two parallel-extending dielectric waveguiding means 2.1, which extend over the length of the waveguide 2 through a dielectric sheath 2.3. The dielectric sheath can also be understood to refer to a dielectric sleeve. The dielectric sheath 2.3 has a lower dielectric constant than the dielectric waveguiding means 2.1. A metallic screen or other screen can be optionally provided between the waveguiding means 2.1. A further sheath and/or other screen can be provided, which sheaths the waveguide 2 or the dielectric sheath 2.3 thereof.

FIG. 9 shows a waveguide 2', which is in the form of a dielectric waveguide cable. The waveguide 2' comprises a dielectric core 2.1 for transmitting an electromagnetic wave, a dielectric sleeve 2.2 for screening the wave to be transmitted and a dielectric sheath 2.3 for protecting the dielectric waveguide 2'.

In FIG. 9, the dielectric core 2.1, in a preferred embodiment, can be formed from polyethylene (PE) and/or polypropylene (PP) and/or polytetrafluoroethylene (PTFE). The core 2.1 preferably has a circular cross-section, wherein other forms can also be provided. A dielectric sleeve 2.2, preferably formed from PE foam, surrounds the dielectric core 2.1 concentrically in FIG. 9. Instead of a PE foam, PTFE strips are also particularly suitable. Other embodiments, in particular made from the other above-mentioned materials, are also possible here. The foam is preferably configured in such a way that it is suitable for storing as much air as possible in the dielectric sleeve 2.2 while having sufficient mechanical stability.

In the embodiment according to FIG. 9, it can preferably furthermore be provided that the dielectric sleeve 2.2, as illustrated, is concentrically surrounded by the dielectric sheath 2.3, wherein the dielectric sheath 2.3 is preferably formed from TPE (thermoplastic elastomer), in particular TPE-S (styrenic block copolymer type thermoplastic elastomer). TPE or TPE-S is a dielectric having particularly high flow factors and advantageous mechanical properties, particularly in terms of the strength against kinking. Furthermore, TPE or TPE-S has good flame resistance. The dielectric sheath 2.3 preferably provides protection both against UV (ultraviolet) radiation and against mechanical influences.

It should be pointed out that the above-mentioned materials for the dielectric core 2.1, the dielectric sleeve 2.2 and the dielectric sheath 2.3 are examples; any other suitable materials can also be used here; in particular, dielectric waveguide cables, such as optical waveguides or a POF (Plastic Optical Fiber), are also known for the optical transmission of signals. Cables of this type generally contain fused silica or PMMA (poly methyl methacrylate).

The dielectric core 2.1 can also have a bore, not illustrated in more detail, which is preferably incorporated in the center. However, it is also conceivable to arrange the bore such that the bore is not symmetrical with respect to the dielectric core 2.1. It is furthermore conceivable to form a plurality of bores in the dielectric core 2.1. The bore can also replace the dielectric core 2.1

The invention is not restricted to the use of a specific one-part waveguide 2 as shown in FIG. 8, a multi-part waveguide 2' as shown in FIG. 9 or a waveguide cable. The exemplary embodiments are also to be understood accordingly.

While the invention has been described with reference to various preferred embodiments, it should be understood by those skilled in the art that various changes may be made and equivalents substituted for elements thereof without departing from the scope of the invention. In addition, many modifications may be made to adapt to a particular situation or application of the invention without departing from the scope of the invention. Therefore, it is intended that the invention not be limited to the particular embodiments disclosed but rather, that the invention will include all embodiments falling within the scope of the appended claims, either literally or under the Doctrine of Equivalents.

What is claimed is:

1. A plug connector for connecting a waveguide to at least one electrical conductor, said plug connector comprising:
    a structure having the at least one electrical conductor;
    a signal converter for carrying out conversion between electrical signals in the at least one electrical conductor and high-frequency electromagnetic waves within the waveguide, the signal converter having an antenna arrangement and being connected to the at least one electrical conductor;
    a housing which is connectable to the waveguide, the signal converter and the antenna arrangement both being located in the housing, the signal converter being fixed in the housing, and
    a waveguiding arrangement inside the housing, the waveguiding arrangement being coupled to the antenna arrangement for guiding the electromagnetic wave into the waveguide;
wherein the plug connector comprises an adapter, and the structure having the at least one electrical conductor comprises a coaxial plug connector.

2. A plug connector for connecting a waveguide to at least one electrical conductor, said plug connector comprising:
    a structure having the at least one electrical conductor;
    a signal converter for carrying out conversion between electrical signals in the at least one electrical conductor and high-frequency electromagnetic waves within the waveguide, the signal converter having an antenna arrangement and being connected to the at least one electrical conductor;
    a housing which is connectable to the waveguide, the signal converter and the antenna arrangement both being located in the housing, the signal converter being fixed in the housing; and
    a waveguiding arrangement inside the housing, the waveguiding arrangement being coupled to the antenna arrangement for guiding the electromagnetic wave into the waveguide;
wherein the plug connector comprises a plug or coupling, and the structure having the at least one electrical conductor comprises a coaxial cable.

3. A plug connector for connecting a waveguide to at least one electrical conductor, said plug connector comprising:
    a structure having the at least one electrical conductor;
    a signal converter for carrying out conversion between electrical signals in the at least one electrical conductor and high-frequency electromagnetic waves within the waveguide, the signal converter having an antenna arrangement and being connected to the at least one electrical conductor;
    a housing which is connectable to the waveguide, the signal converter and the antenna arrangement both being located in the housing, the signal converter being fixed in the housing, and
    a waveguiding arrangement inside the housing, the waveguiding arrangement being coupled to the antenna arrangement for guiding the electromagnetic wave into the waveguide;
wherein the waveguide inserts into the housing in an insertion direction which is inclined by forty five degrees to ninety degrees (45° to 90°) with respect to a line which is orthogonal to a contact area of the housing.

4. A plug connector for connecting a waveguide to at least one electrical conductor, said plug connector comprising:
    a structure having the at least one electrical conductor;
    a signal converter for carrying out conversion between electrical signals in the at least one electrical conductor and high-frequency electromagnetic waves within the waveguide, the signal converter having an antenna arrangement and being connected to the at least one electrical conductor;
    a housing which is connectable to the waveguide, the signal converter and the antenna arrangement both being located in the housing, the signal converter being fixed in the housing, and
    a waveguiding arrangement inside the housing, the waveguiding arrangement being coupled to the antenna arrangement for guiding the electromagnetic wave into the waveguide;
wherein the waveguiding arrangement is angled for alignment with a main radiation direction of the antenna arrangement.

* * * * *